United States Patent [19]

Norsworthy

[11] Patent Number: 5,457,456

[45] Date of Patent: Oct. 10, 1995

[54] DATA CONVERTER WITH PROGRAMMABLE DECIMATION OR INTERPOLATION FACTOR

[75] Inventor: Steven R. Norsworthy, Emmaus, Pa.

[73] Assignee: AT&T IPM Corp., Coral Gables, Fla.

[21] Appl. No.: 168,437

[22] Filed: Dec. 16, 1993

[51] Int. Cl.⁶ .................................................. H03M 7/00
[52] U.S. Cl. ............................................. 341/61; 341/143
[58] Field of Search ................................... 341/61, 143, 50, 341/123, 155; 375/25–30, 33, 34; 364/724.1

[56] References Cited

U.S. PATENT DOCUMENTS

| | | | |
|---|---|---|---|
| 4,460,890 | 7/1984 | Busby | 341/61 |
| 4,996,528 | 2/1991 | Asghar et al. | 341/61 X |
| 5,113,189 | 5/1992 | Messer et al. | 341/143 |
| 5,144,308 | 9/1992 | Norsworthy | 341/131 |
| 5,159,338 | 10/1992 | Takahashi | 341/61 |
| 5,159,339 | 10/1992 | Fujita | 341/61 |

OTHER PUBLICATIONS

An Audio Engineering Society Preprint Presented at the 95th Convention 1993, Oct. 7–10, New York, "A Single Chip Stereo Audio Codec for PC Multimedia Applications", by Scott McDonald, et al., Crystal Semiconductor Corporation, Austin, Tex., pp. 1–13.
Oversampling Delta–Sigma Data Converters, Theory, Design and Simulation, edited by James C. Candy and Gabor C. Temes, IEEE Press, A Selected Reprint Volume published in 1992, "Oversampling Methods for A/D and D/A Conversion", pp. 1–29.
Motorola DSP56166 "Digital Signal Processor" User's Manual, pp. 6–2–6–29. Printed in USA May 1993.
"On the Use of Modulo Arithmetic Comb Filters in Sigma Delta Modulators", Dijkstra, E., et al., Centre Suisse D'Electronique Et De Microtechnique S.A. Maladiere 71, 2007 Neuchatel, Switzerland, Reprinted from IEEE Proc. ICASSP'88, pp. 2001–2004, Apr. 1988.
Motorola DSP5616 "Digital Signal Processor" User's Manual, pp. 6–10–6–11 as well as lithographers footnote 1ATX31336–0 Printed in USA May, 1993.

*Primary Examiner*—Marc S. Hoff
*Attorney, Agent, or Firm*—David L. Smith

[57] ABSTRACT

In accordance with an embodiment of the invention, a data converter is disclosed that provides a sampling rate conversion. The converter receives a clock signal, a divided-down clock signal, and first digital signal samples at a first rate. The converter converts the first digital signal samples to second digital signal samples at a second rate. The ratio of the first rate to the second rate is defined as a fist conversion rate factor. A first programmable counter receives the clock signal and divides down the clock signal to produce a divided-down clock signal. The first programmable counter is programmable to selectively determine the first conversion rate factor.

In an alternate embodiment, another stage of sampling rate conversion is provided by a second data converter. The second converter receives the divided-down clock signal, a further divided-down clock signal, and the second digital signal samples. The second data converter converts the second digital signal samples to the third rate. The ratio of the second rate to the third rate is defined as a second conversion rate factor. A second programmable counter receives the divided down clock signal and divides it down to produce a further divided-down clock signal. The second programmable counter programmable to selectively determine the second conversion rate factor.

20 Claims, 4 Drawing Sheets

DATA CONVERTER WITH PROGRAMMABLE DECIMATION OR INTERPOLATION FACTOR

TECHNICAL FIELD

This application relates generally to data converters such as encoders or decoders for converting signals from analog-to-digital form, or from digital-to-analog form, and particularly to such converters including a capability to divide an incoming clock frequency by a programmable quantity to result in a variable interpolation or decimation factor.

BACKGROUND OF THE INVENTION

Data converters are used in many applications such as telephone switching equipment, voice-band data communications, speech coding systems, and audio and video signal processing equipment. Data converters may include multiple stages of interpolation or decimation. Each stage of the interpolation operates at a frequency that is different from the frequency of other stages of interpolation. Similarly, each stage of decimation operates at a frequency that is different than the frequency of operation of other stages of decimation. The frequency of operation of the various stages are dependent on the frequency of operation of the initial stage of interpolation. Similarly, the frequency of operation of subsequent stages of decimation are dependent on the frequency of operation of the initial stage of operation. Therefore, the clock frequency of the initial stage of interpolation (or decimation) has typically been divided down in a hardware divide circuit, such as a series of flip-flops, to provide the appropriate frequencies for subsequent stages of interpolation or decimation. The dependent relationship between the frequency of operation of one stage and the frequency of operation of a subsequent stage was fixed and remained unchanged.

A need exists for a technique useful with multiple-stage interpolation or decimation that would permit the relationship between the frequency of operation of one stage and the frequency of operation of a subsequent stage to be varied. Such a technique would permit maintaining the clock frequency constant and changing the interpolation or decimation factor for each stage. Being able to change the interpolation or decimation factor for each stage would permit the overall interpolation or decimation factor, which is the product of the interpolation or decimation factor for each stage, to be programmable resulting in a versatile interpolation or decimation capability with multiple applications.

SUMMARY OF THE INVENTION

In accordance with an embodiment of the invention, a data converter provides a sampling rate conversion. The converter receives a clock signal, a divided-down clock signal, and first digital signal samples at a first rate. The converter converts the first digital signal samples to second digital signal samples at a second rate. The ratio of the first rate to the second rate is defined as a first conversion rate factor. A first programmable counter receives the clock signal and divides down the clock signal to produce a divided-down clock signal. The first programmable counter is programmable to selectively determine the first conversion rate factor.

In an alternate embodiment, another stage of sampling rate conversion is provided by a second data converter. The second converter receives the divided-down clock signal, a further divided-down clock signal, and the second digital signal samples. The second data converter converts the second digital signal samples to third digital signal samples at a third rate. The ratio of the second rate to the third rate is defined as a second conversion rate factor. A second programmable counter receives the divided down clock signal and divides it down to produce a further divided-down clock signal. The second programmable counter programmable to selectively determine the second conversion rate factor.

DETAILED DESCRIPTION

Figure 1:
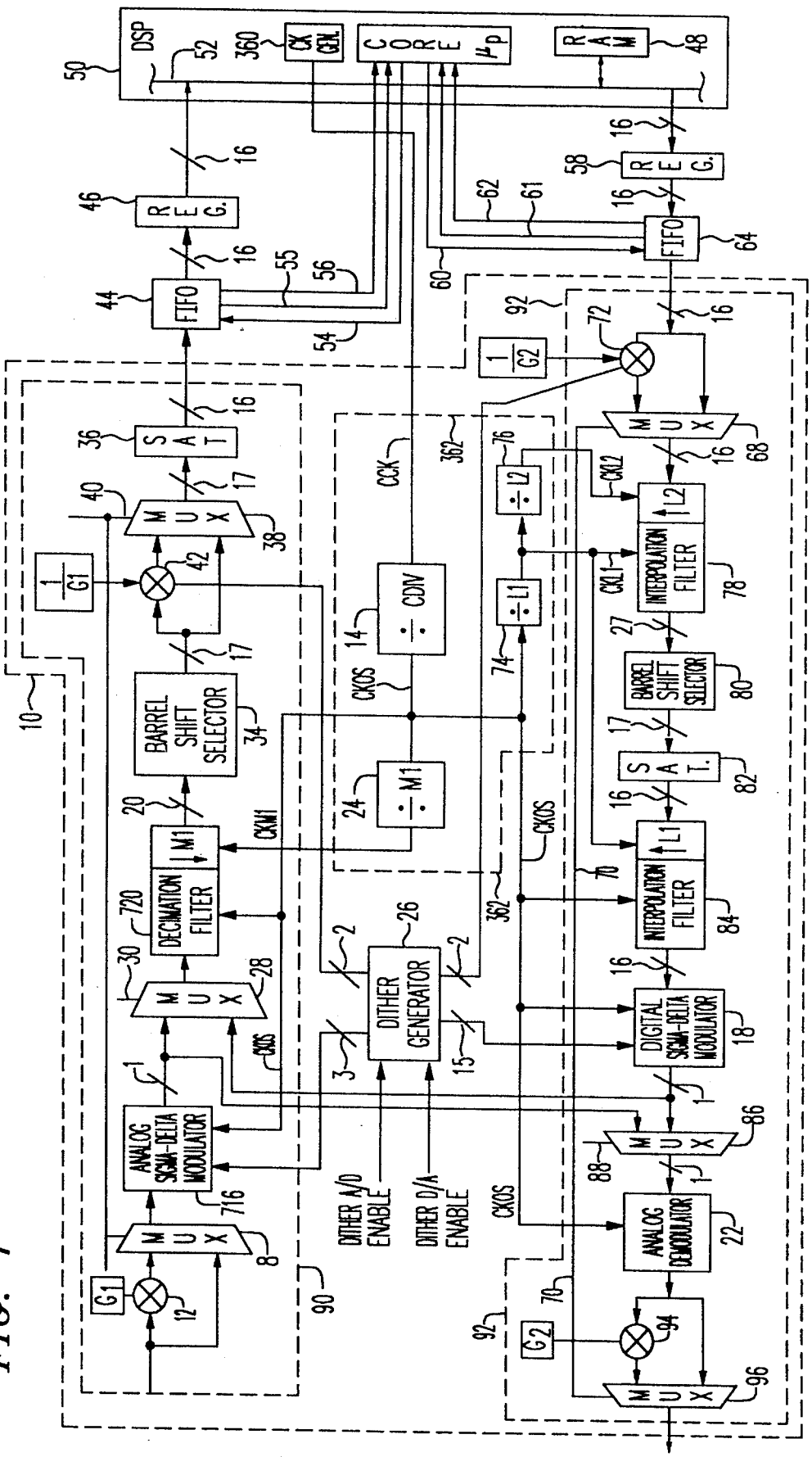
FIG. 1 is a block diagram of a data converter in accordance with the present invention.

An illustrative data converter 10 including gain dither and rounding is shown in FIG. 1. Data converter 10 is shown as having an analog-to-digital (A/D) conversion signal path including coder 90, which is an A/D type data converter. The A/D conversion path includes an analog sigma-delta modulator 716, decimation filter 720, barrel shift selector 34 and saturation circuit 36. The digital-to-analog (D/A) conversion signal path includes decoder 92 which is a D/A type data converter. The D/A conversion path includes interpolation filter 78, barrel shift selector 80, saturation circuit 82, interpolation filter 84, digital sigma-delta modulator 18 and analog demodulator 22.

Data converter 10 is clocked by incoming clock signal CCK as divided by a programmable divide-by-CDIV clock divider 14 to produce the oversampling clock signal CKOS. Oversampling clock signal CKOS is provided as an input to and is used by analog sigma-delta modulator 716, digital sigma-delta modulator 18, decimation filter 720, interpolation filter 84, and analog demodulator 22. In a preferred embodiment, the sigma-delta modulators are second order. Oversampling clock signal CKOS is also coupled as the input of programmable divide-by-M1 counter 24 and programmable divide-by-L1 counter 74. M1 is the decimation factor of decimation filter 720. The output of divide-by-M1 counter 24 provides to decimation filter 720 a second clock signal, decimation clock signal CKM, that has a frequency equal to that of the oversampling clock signal CKOS divided by the decimation factor M1. The upstream portion of decimation filter 720 operates at the rate of clock CKOS. The downstream portion operates at the lower, decimated rate of clock CKM. In a illustrative embodiment, decimation filter 720 is a third-order comb filter.

The analog input signal to the A/D conversion signal path 90 provides one input directly to multiplexer 8. The analog input signal multiplied by a programmable gain G1 in multiplier 12 is provided as the other input to multiplexer 8. Multiplexer 8 is responsive to select input 40 to selectively provide one of its analog inputs as its analog output signal.

The analog output signal provided by multiplexer 8 is received by analog sigma-delta modulator 716 as its input.

The analog sigma-delta modulator, which may receive dither from dither generator 26, converts the scaled analog input signal into a 1-bit-per-sample first digital data stream. As is known in the art, the 1-bit-per-sample first digital data stream generated by a sigma-delta modulator is converted from a signal represented by zeroes and ones (unsigned data format) to a two-bit-per-sample signal represented by minus ones and plus ones which are consistent with two's complements or sign-magnitude format. Such a representation has a midpoint represented by zero, can take the form of a two's-complement word, and has a sign associated with each value. The output of analog sigma-delta modulator 716 provides an input to multiplexer 28. Multiplexer 28 is responsive to user-determined select input 30 to selectively provide one of its inputs at its output. The output of multiplexer 28 is coupled as the input to decimation filter 720.

Decimation filter 720 filters and decimates the 1-bit-per-sample first digital data stream into a 20-bit-per-sample second digital data stream at the frequency of clock CKM1. The filtering removes out of band energy. In the illustrative embodiment, decimation filter 720 is a third-order comb filter.

Barrel shift selector 34 receives the second digital data stream from the output of decimation filter 720, up to 20 bits per sample, and produces as an output a third digital data stream having 17 bits per sample. The barrel shift selector 34 is programmable and can be varied to select one of four possible bit fields: bits 0–16, 1–17, 2–18, or 3–19.

The 17-bit-per-sample third digital data stream output from barrel shift selector 34 provides the input to saturation circuit 36 through multiplexer 38. The output from barrel shift selector 34 is provided directly as one input to multiplexer 38. The output from barrel shift selector 34 is multiplied by the gain 1/G1 in multiplier 42 as the other input to multiplexer 38. Dither from generator 26 may be added to the gain scaling. Multiplexer 38 is responsive to select input 40 to selectively provide one of its inputs at its output.

Multiplexers 8 and 38 are both responsive to select input 40 such that when the input to multiplexer 8 that is multiplied by gain G1 is selected, the input to multiplexer 38 that is multiplied by gain 1/G1 is selected. Gain scaling employing gain G1 and 1/G1 result in a pulse code modulated output from multiplexer 38 that is full scale, 0 dB reference, when the analog input signal to analog sigma-delta modulator 716 is less than full scale. Gain G1 is selected to maintain unity gain. In the manner, the absolute gain of the analog-to-digital signal path (from multiplexer 8 input to multiplexer 38 output) is the same whether gain scaling is employed or not.

Saturation circuit 36 takes the 17-bit-per-sample fourth digital data stream output from multiplexer 38 and reduces each data sample to a 16 bit sample. The output of saturation circuit 36 is a 16-bit-per-sample fifth digital data stream.

The 16-bit-per-sample fifth digital data stream output from saturation circuit 36 is loaded into a first-in-first-out (FIFO) register 44. Register 44 stores several such samples of data. From FIFO 44, the 16 bit samples are temporarily transferred to register 46 prior to being written to random access memory (RAM) 48. Ram 48 is part of digital signal processor (DSP) 50. A DSP is a special purpose microprocessor developed to efficiently perform mathematical operations on real-time digital data. The samples are transferred by way of the internal data bus 52 as controlled by depth flag 54 and interrupt flag 56.

The digital-to-analog conversion signal path converts digital data from RAM 48 of DSP 50 into analog form at the output of analog demodulator 22. Digital data from RAM 48 of DSP 50 for conversion to analog form is written as a 16 bit sample temporarily to register 58. Each 16 bit sample is then transferred to FIFO 64 as controlled by depth flag 60, status flag 61, and interrupt flag 62. The output from FIFO 64 is a 16-bit-per-sample sixth digital data stream. The sixth digital data stream is input to interpolation filter 78 through multiplexer 68. The sixth digital data stream output from FIFO 64 is provided directly as one of the inputs to multiplexer 68. The sixth digital data stream is multiplied by the inverse of gain G2 in multiplier 72 as the other input to multiplexer 68. Multiplexer 68 is responsive to a select input 70 to selectively provide one of its inputs as its output. The output of multiplexer 68 is a seventh digital data stream.

The seventh digital data stream is provided as the input to interpolation filter 78. Interpolation filter 78 receives clocks CKL1 and CKL2. Clock CKL1 is clock CKOS divided by interpolation factor L1. Clock CLK2 is clock CLK1 divided by interpolation factor L2. The output from interpolation filter 78 is a 27-bit-per-sample eighth digital data stream. Interpolation filter 78, in a illustrative embodiment, is a third-order comb filter that removes out-of-band energy and produces the eighth digital data stream at a frequency of the over sampling frequency as divided by L1. The upstream portion of interpolation filter 78 operates at the lower clock rate CLK2. The downstream portion operates at the higher clock rate CLK1.

The eighth digital data stream provides the input to barrel shift selector 80. Barrel shift selector 80 receives the 27-bit-per-sample eighth digital data stream from the output of interpolation filter 78 and selects a field of 17 bits per sample to provide as its output, a ninth digital data stream. The field of barrel shift selector 80 is programmable. In the exemplary embodiment there are eleven possible seventeen bit fields. In a illustrative embodiment, the field of barrel shift selector 80 is programmed to select one of the top seven bit fields: 4-20; 5-21; 6-22; 7-23 through 10-26.

Saturation circuit 82 receives the 17-bit-per-sample ninth digital data stream output from barrel shift selector 80 and reduces each sample to 16 bits to provide a tenth digital data stream substantially in the same manner as saturation circuit 36.

Interpolation filter 84 receives the tenth digital data stream and operates at the oversampling clock rate, as divided by programmable divide by L1. The upstream portion of interpolation filter 84 operates at the lower clock rate CKL1. The downstream portion operates at the higher clock rate CKOS. Interpolation filter 84, in a illustrative embodiment is a first-order comb filter that removes out of band energy and produces an eleventh digital data stream as an output.

The eleventh digital data stream output of interpolation filter 84 is coupled as the input to digital sigma-delta modulator 18. Digital sigma-delta modulator 18 in a illustrative embodiment is second order. Modulator 18 may receive dither from dither generator 26 and converts the 16-bit-per-sample data into a 1-bit-per-sample twelfth digital data stream.

The output of digital sigma delta modulator 18 provides an input to multiplexer 86. Multiplexer 86 is responsive to select input 88 to selectively provide one of the inputs at its output. The multiplexer output is a 1-bit-per-sample thirteenth digital data stream.

Analog demodulator 22 is a 1-bit sample and hold converter which converts the 1-bit-per-sample thirteenth digital data stream received from multiplexer 86 into a step wise continuous analog output signal. Analog demodulator 22 includes one or more analog filters as known in the art to smooth the analog output signal. The analog output signal from analog demodulator 22 is provided directly as one of the inputs to multiplexer 96 and is multiplied by gain G2 in multiplier 94 to provide the other input to multiplexer 96. Gain G2 may be achieved in any known manner. Multiplexer 96 is responsive to select input 70 to selectively provide one of its inputs as its output. The output of multiplexer 96 is an analog signal. Multiplexers 68 and 96 are both responsive to select input 70 such that when the input to multiplexer 68 that is multiplied by gain 1/G2 is selected, the input to multiplexer 96 that is multiplied by gain G2 is selected. Gain G2 is selected to maintain unity gain. In this manner, the absolute gain of the digital-to-analog signal path (from multiplexer 68 input to multiplexer 96 output) is the same whether or not gain scaling is employed.

To reduce the number of interrupts incurred by the DSP, a register is provided to temporarily store the digital data stream samples available to the DSP. Data could asynchronously tipple through the register or could be synchronously clocked through the register. In a preferred embodiment, the register is a synchronous first-in-first-out register 44. In a preferred embodiment, the register is a synchronous first-in-first-out register 44. The decimated digital data stream output from decimator 20 passes through barrel shift selector 34 and saturation block 36 resulting in a 16-bits-per-sample digital data stream. Each 16-bit-per-sample word is stored in the next available register in FIFO 44. By way of example, a typical FIFO would have a number of registers, such as 8 registers, each restoring a 16 bit word. A programmable FIFO depth pointer 54 is set to a pre-selected number of registers, typically less than the full depth of the FIFO, to define when the FIFO is "full" for purposes of interrupting the DSP. Depth pointer 54 of FIFO 44 is programmable to any integer from one to the full depth of the FIFO. FIFO status flag 55 indicates the instantaneous number of samples stored in FIFO 44. When the number of registers indicated by the depth flag are full, the interrupt flag 56 transitions to interrupt the DSP. The DSP goes into the interrupt service routine and upon servicing the FIFO 44 interrupt, each word stored in FIFO 44 is transferred from its location in FIFO 44 temporarily to register 46 prior to being transferred to DSP 50 RAM 48. When the depth flag is set to a value less than the total depth of FIFO 44, all of the digital data samples stored in FIFO 44 do not have to be transferred to DSP RAM prior to receipt of the next digital data sample from the saturation circuit, thereby providing flexibility in the timing of servicing the interrupt. The registers represented by the difference between the capacity of FIFO 44 and the depth flag setting are available for use to cushion the timing of the interruption of the DSP. When all of the registers of FIFO 44 are full, the DSP must assure that data is transferred from the FIFO to DSP RAM prior to the FIFO receiving the next digital data sample from saturation block 36, or an overflow condition will result upon receiving the next data.

Figure 2:
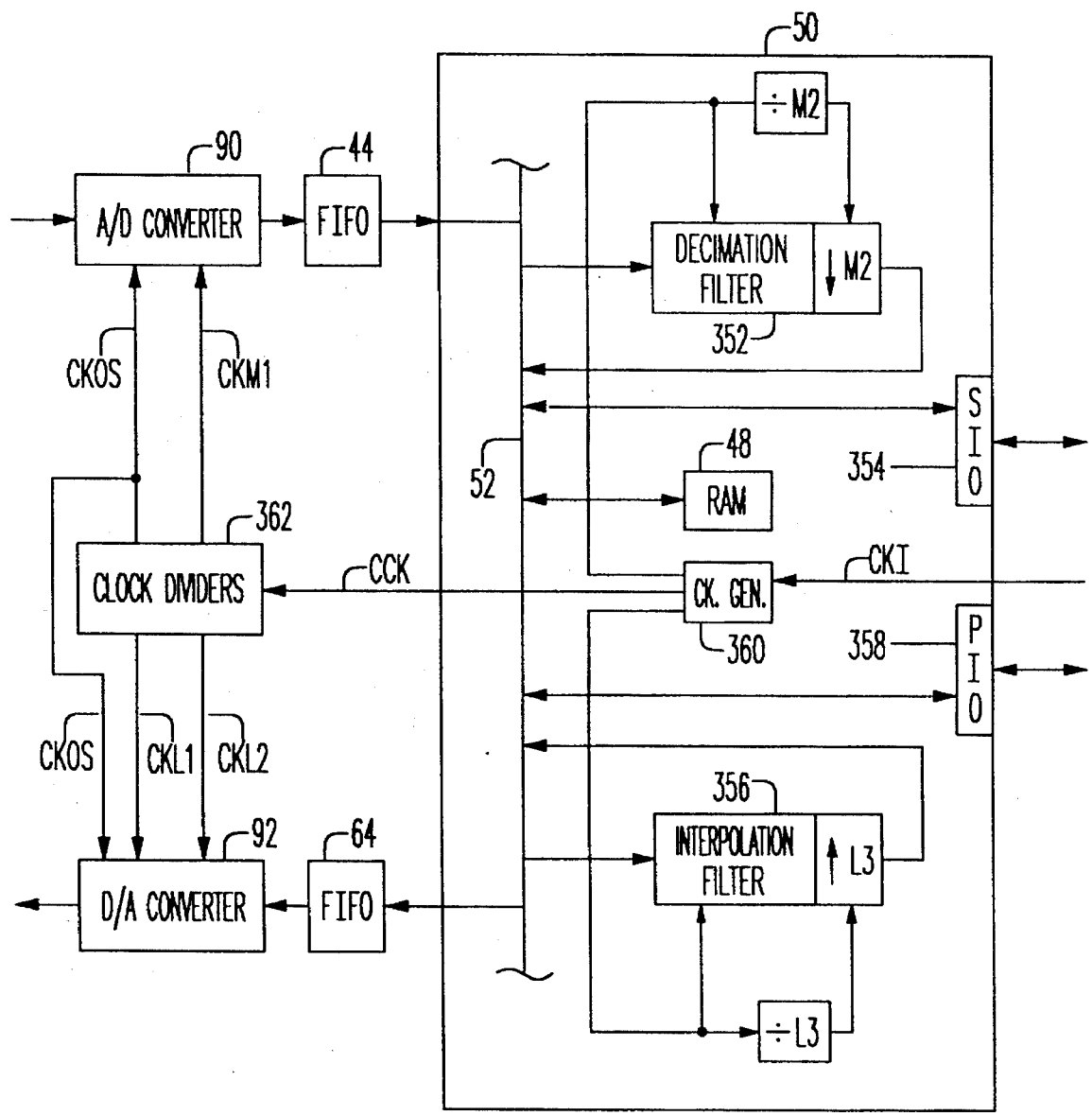
FIG. 2 is a block diagram of a portion of the data converter of FIG. 1.

Sampling rate conversion can also be implemented within DSP 50 in another stage of decimation, as shown in FIG. 2. The digital data samples transferred to DSP 50 are lowpass filtered then decimated by a decimation factor of M2 in decimation filter 352. Whereas the data processed by the hardware decimator is typically processed synchronously, the data processed by the decimator within DSP 50 can be processed either synchronously or in bursts. For the decimation within DSP 50, a clock signal appropriate for the mode of operation of decimation filter 352 is generated by clock generator 360. A second clock signal is derived therefrom by dividing the clock signal by decimation factor, M2.

The oversampling ratio is the product of the decimation factors of all of the stages of decimation. The two stages of decimation here result in a total oversampling ratio of M1×M2. For each M2 digital data samples received from FIFO 44, one decimated digital data sample is produced by decimation filter 352. Typically, depth pointer 54 would be set to a value that is equal to, a submultiple, or a supermultiple of decimation ratio M2. For example, if M2 was 4, the depth pointer could be set to 1, 2, 4, 8, 12, ... up to the depth of the FIFO. During a single interrupt, the DSP would read the digital data samples available for transfer to RAM, then jump out of the interrupt service routine. When the depth pointer is greater than one, the number of interrupts experienced by the DSP to receive digital data samples is reduced as compared to interrupting the DSP each time digital data samples become available. Setting the depth pointer to 4 reduces to ¼ the number of interrupts to transfer the same quantity of digital data samples when compared to transferring one sample of digital data per interrupt. Upon each interrupt, the DSP would typically transfer the number of digital data samples set by the depth pointer, in this example, 4. When the FIFO depth pointer is set lower than the magnitude of decimation factor M2, more than one interrupt will be required to provide M2 data samples to decimation filter 352 to perform the decimation function in DSP 50. Correspondingly, when the depth pointer is greater than M2, more than M2 digital data samples are transferred during each interrupt. Multiple decimation operations may be performed by DSP 50 between some or all of the interrupts. If the FIFO depth pointer is less than the total depth of the FIFO, additional samples can be written into the FIFO before it overflows, hence, the DSP does not have to service the interrupt to the interrupt without loss of data.

Once the digital data has been decimated by DSP 50, the decimated digital data samples may be further processed by DSP 50 or stored in RAM 48. Alternatively, the decimated digital data could be provided to serial or parallel input/output port 354 to be taken off of the DSP chip.

Absent the FIFO, the DSP would take one digital data sample, or word, at a time until the minimum number of words for processing had been transferred to the DSP. Employing FIFO 44 enables the number of words selected to be transferred upon the occurrence of each interrupt to be selected as at least the minimum number for DSP processing, or a multiple of the minimum number.

The number of interrupts is also reduced in the D/A path. To reduce the number of interrupts incurred by the DSP, a register is provided to temporarily store the digital data stream samples being received from the DSP. In a preferred embodiment, the register is a synchronous first-in-first-out data register (FIFO) 64. The digital data stream received from DSP 50 is temporarily stored in register 58 before being transferred to FIFO 64. Each 16-bit-per-word digital data sample is stored in the next available register in FIFO 64. A programmable FIFO depth pointer 60 is set to a pre-selected number of registers, typically zero. The FIFO depth pointer 60 defines the minimum number of registers holding data when the FIFO is considered "empty" for purposes of interrupting the DSP. When the depth pointer 60 is set to more than this minimum depth of the FIFO, a buffer is built in such that there may be additional digital data samples available in FIFO 64 even when the FIFO depth pointer 60 indicates the FIFO is empty. The number of registers represented by the depth pointer setting are available to cushion interruption of the DSP. When all of the registers of FIFO 64 are empty, the DSP must assure data is transferred from the DSP RAM to FIFO 64 prior to interpolation filter 78 requiting the next digital data sample. FIFO status flag 61 indicates the instantaneous number of samples stored in FIFO 64. When the number of registers indicated by the depth flag are empty, interrupt flag 62 transitions to interrupt the DSP. An underflow condition will occur when the FIFO is empty and decoder 92 attempts to read the next sample.

Sampling rate conversion can also be implemented within DSP 50 in another stage of interpolation. Digital data samples acquired from RAM 48, generated within DSP 50, or received through serial input port 354 or parallel input port 358 are interpolated by interpolation filter 356. Interpolation filter 356 interpolates the digital data samples it receives by an interpolation factor L3 and low pass filters the interpolated samples. Whereas the hardware interpolation described above with respect to interpolation filters 78 and 84 is typically conducted in real time, the interpolation within DSP 50 can be achieved either synchronously or in bursts. For the interpolation within DSP 50, a clock signal appropriate for the mode of operation of interpolation filter 356 is generated by clock generator 360. A second clock signal is derived therefrom by dividing the clock signal by the interpolation factor, L3.

Interpolation filter 356 interpolates the digital data samples at a rate $F_S$, producing L3 samples for each digital data sample received. By way of example, the depth pointer could be set to zero, indicating that FIFO 64 is empty when the FIFO empty flag reaches zero. A DSP interrupt is then generated, and the DSP writes L3 data samples to the FIFO. The next interrupt would occur when oversampling decoder 92 reads all L3 samples, and the FIFO empty pointer again reaches zero. In this example, the number of interrupts is reduced by a factor of L3 as a result. In another example, if L3 is larger than the maximum depth of the FIFO, a submultiple of L3 number of data samples, such as (L3)/2, can be written to the FIFO at the time of the interrupt. In yet another example, a number of data samples that is a supermultiple of L3, such as 2(L3), can be written to the FIFO at the time of the interrupt. In any of these examples, the FIFO depth pointer could alternatively be set to a value of one or more, rather than zero, which allows a cushion of time before the DSP must service the interrupt. If the FIFO pointer is set to (L3)-1, this cushion time interval consists of one complete set of interpolated data samples from the DSP. This can be useful in applications where system-level interrupts of the DSP occur at submultiples of the baseband data rate going into interpolation filter 356. Such an example can occur in a modem, where the symbol rate is typically at least a factor of two less than the baseband data rate.

A comb filter, also known as a sinc filter, is a specific type of lowpass filter having nulls at multiples of a frequency and an envelope magnitude response that is $$|H(\omega)| = \left[ \frac{\sin(\omega M1/2)}{\sin(\omega/2)} \right]^K$$

Comb filters are used as wide band filters in data converters and are typically followed in the data path by a narrow band filter to remove alias images. Variables K and M1 can be used to represent a comb function where K is the order of the comb filter and M1 is the decimation (or interpolation) factor of the comb filter. Typical values for the parameter M1 are 16, 32 or 64. Typical values for the parameter K are 2, 3, 4 or 5. Comb filters are used in data converters that include a sigma-delta converter wherein the order of the comb filter is typically at least one greater than the order of the sigma-delta converter.

The decimation filter or interpolation filter is followed by a barrel shift selector because as parameter M1 is varied, the appropriate sample widths also vary. In addition, the location of the significant bits in the sample produced will vary.

Figure 3:
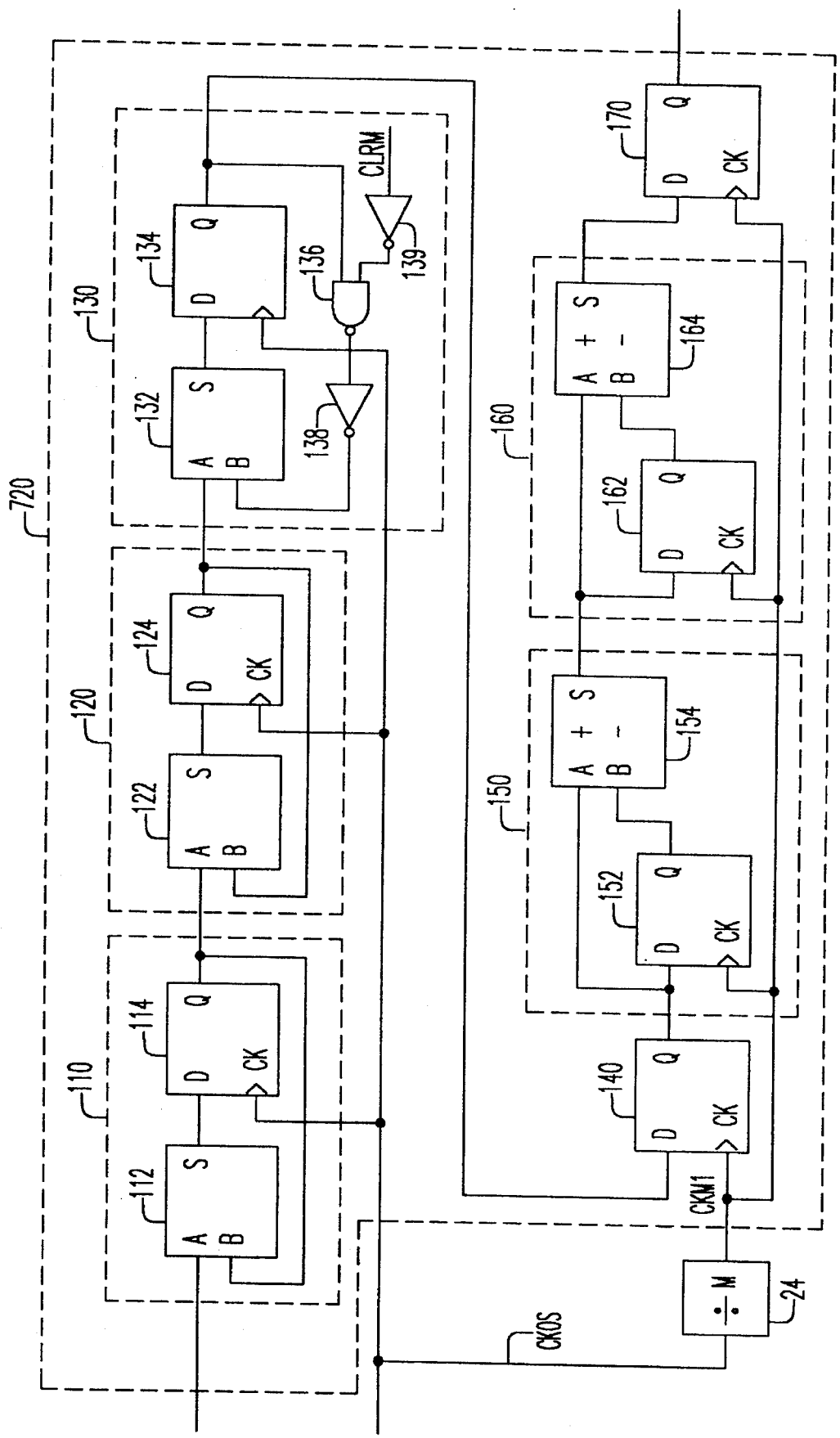
FIG. 3 is a circuit diagram of a comb cubed decimation filter having programmable decimation rate resulting in a variable decimation factor.

The circuit diagram of an exemplary versatile decimation filter 720 is shown in FIG. 3 as a third-order comb filter. While a third-order comb filter is shown, the invention is not limited thereto. Decimation filter 720 is comprised of twenty circuits as shown in FIG. 3, one for each bit in the word being processed. Decimation filter 720 is comprised of 20-bit accumulators 110, 120 and 130, followed by holding register 140 and 20 bit differentiators 150, 160 and holding register 170. Accumulator 110 includes 20 bit adder 112 followed by 20 bit register 114. The A input to adder 112 is the output from a buffer which provides 16-bit data. The 16-bit data is sign extended to 20 bits as the input to accumulator 110 and adder 120. The output of adder 112 is coupled as the input to register 114. Register 114 delays the input one clock cycle. The output of register 114 is fed back to and provides the B input to adder 112. The output of register 114 also provides the output of accumulator 110.

Accumulator 120 functions in the same manner as accumulator 110. The output from accumulator 110 is coupled to and provides the input to accumulator 120 which is also the A input to adder 122. Accumulator 120 includes adder 122 followed by register 124 with the output of adder 122 coupled as the input to register 124. The output of register 124 is delayed by one clock cycle from the input and is fed back to provide the B input to adder 122. The output from register 124 also provides the output from accumulator 120.

The output of accumulator 120 provides the input to accumulator 130 which also is the A input to adder 132. Accumulator 130 performs the third accumulator function and simultaneously the first differentiation function. The output of adder 132 is coupled to and provides the input to register 134. The output of register 134, which is also the output of accumulator 130, is fed back as the B input to adder 132 through NAND gate 136 and inverter 138. The output of inverter 139 provides the second input to NAND gate 136.

Data is clocked into accumulators 110, 120 and 130 at the oversampling clock rate of clock CKOS. The data is 1-bit-per-sample data from analog sigma-delta modulator 16 that is convened to a two-bit two's complement representation, then is sign extended to 20 bits. This representation results in a signed digital signal with no offset. Each decimation filter has a first portion that operates at a lower clock rate and a second portion that operates at a higher clock rate. Within a decimation filter, accumulators operate at the higher clock rate and differentiators operate at the lower clock rate.

The accumulator clear function is implemented by NAND gate 136 and inverters 138 and 139 clocked by a clock at the lower clock rate. After divide-by-M1 counter 24 divides M1 times, that is after divide-by-M1 counter 24 counts M1 pulses of clock signal CKOS, divide-by-M1 counter 24 provides a pulse output CKM which provides the input to inverter 139. When a high input is provided to inverter 139, the output of inverter 139 is driven low. A low at the output of inverter 139 provides a low and the second input of NAND gate 136. A low on one input of NAND gate 136 produces a high on the output of NAND gate 136, without regard to the state of the other input. A high output on NAND gate 136 provides the input to inverter 138 which results in a low output from inverter 138. Thus, as long as the input to inverter 139, CKM is high, zero-valued words are provided as the B input to adder 132 that disables the feedback. The zero-valued words at the B input to adder 132 terminates the accumulation process and the input data to accumulator 130 passes through accumulator 130 to the output thereof. This clears adder 132 and dumps the accumulated adder contents onto the output of accumulator 130, thereby clearing accumulator 132.

The output from accumulator 130 provides the input to holder register 140. Holding register 140 holds the output received from accumulator 130 for M1 oversampled clock pulses or cycles, because holding register 140 receives the divided-down clock signal.

Accumulator 130 also provides the first differential function. The first differential is accomplished by clearing the input to NAND gate 136 one of each M1 oversampled clock cycles.

The output from holding register 140 is clocked into differentiator 150 at the lower clock rate. Differentiator 150 comprises register 152 which receives the output from holding register 140, delays the data received by one lower clock cycle and provides its output as the B input to adder 154. The output from holding register 140 is available as the A input to adder 154. Adder 154 subtracts the output of register 152 from the data received directly from holding register 140 producing the second differential at the sum output of adder 154, which is also the output of second differentiator 150. Differentiator 160 receives as its input the output from differentiator 150. Register 162 receives the input, delays the data received by one lower clock cycle (CKM1) and provides its output as the B input to adder 164. The input to differentiator 160 is also provided as the A input to adder 164. Adder 164 subtracts the output of register 162 from the data received directly from differentiator 150 producing the third differential at the sum output of adder 160, which is also the output of third differentiator 160.

Holding register 170 receives as its input the output from differentiator 160 and functions as a buffer stage. Latches 140 and 170 as well as differentiators 150 and 160 are clocked by the lower clock signal, the output of divide-by-M1 counter 24.

By changing the value of M1, the divider, the frequency of the clear pulse is varied which results in changing the decimation ratio. Once the differentiator clock rate is determined, the accumulator clock rate would depend therefrom. Parameter M1 can take on any continuous value 1 or greater: 1, 2, 3, 4, . . . . If M1 exceeds 64, the 20 bit data bus would have to be increased to retain the significant bits.

Figure 4:
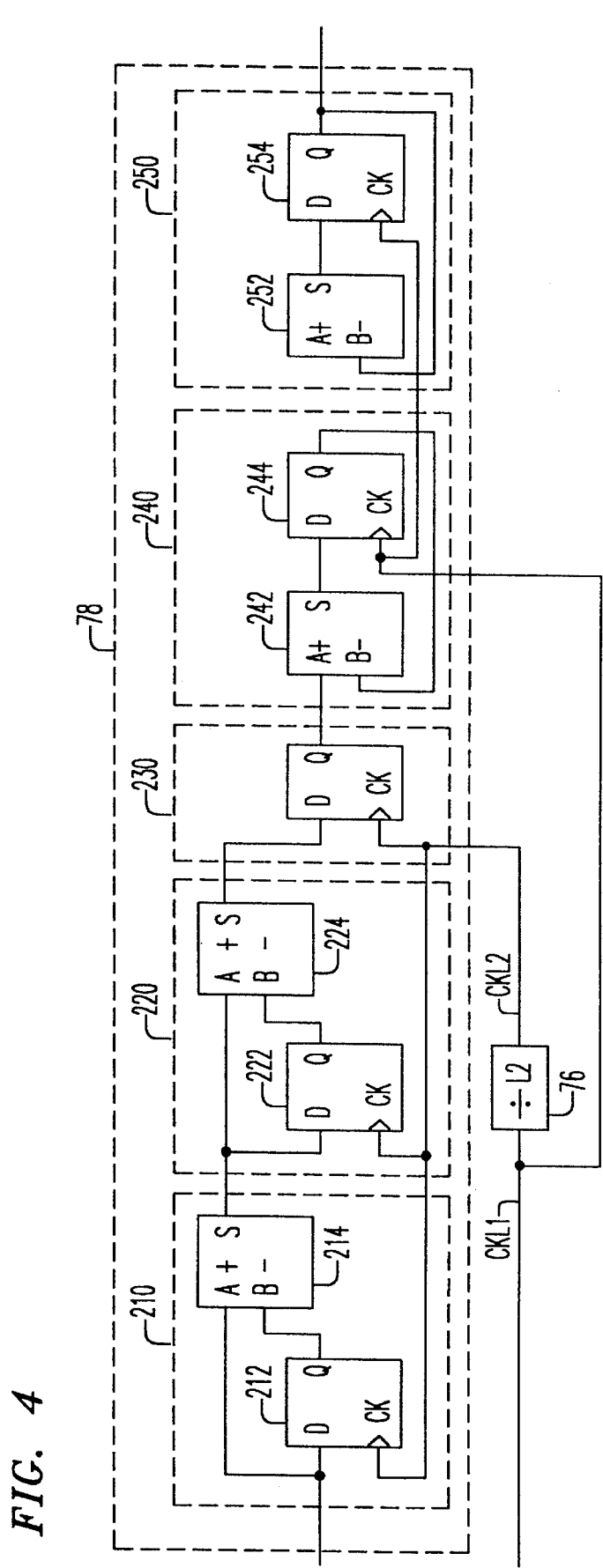
FIG. 4 is a circuit diagram of a comb cubed interpolation filter having programmable interpolation rate resulting in a variable interpolation factor.

An exemplary versatile interpolation filter 78 is shown is FIG. 4 for a third-order comb filter. The interpolator employs three differentiators followed by three accumulators, substantially the reverse of the decimator. The three differentiators and three accumulators can be realized by K-1 differentiators and K-1 accumulators, where, as above, K is the order of the comb function. In the exemplary interpolator, the three differentiators and three accumulators can be realized by two physical differentiators and two physical accumulators. An equation describing the magnitude response of the interpolation comb filter is given by $$|H(\omega)| = \left[ \frac{\sin(\omega L2/2)}{\sin(\omega/2)} \right]^K$$

Data is received by interpolation filter 78 from first-in-first-out register 64 through multiplexer 68 at the input to differentiator 210 as a 16 bit sample. The interpolation filter is implemented with sixteen circuits as shown is FIG. 3, one for each bit in the 16 bit sample. The output for multiplexer 68 is clocked into differentiator 210 and received by holding register 212. Holding register 212 delays the data received by one CKL2 clock cycle and provides its output as the B input to adder 214. The output of multiplexer 68 is also available as the A input to adder 214. Adder 214 subtracts the output of register 212 from the data received from multiplexer 68, producing the first differential at the sum output of adder 214, which is also the output of differentiator 210. Differentiator 220 receives as its input the output from differentiator 210. Register 222 receives the input, delays the data received by one CKL2 clock cycle and provides its output as the B input to adder 224. The input to differentiator 220 is provided as the A input to adder 224. Adder 224 subtracts the output of register 222 from data received directly from differentiator 210 producing the second differential at the sum output of adder 224, which is also the output of second differentiator 220.

Holding register 230 receives the data output from differentiator 220 and introduces a one delay of clock cycle to the data. Register 230 provides the function of producing the third differential and the first accumulate function. Differentiators 210 and 220 as well as register 230 are clocked by the output of divide by L2 counter 76.

The output of holding register 230 provides the input to accumulator 240 which is the A input to adder 242. Accumulator 240 performs the second accumulate function. The output of adder 242 is couple to and provides the input to register 244. The output of register 244, which is also the output of accumulator 240, is fed back as the B input to adder 242. Adder 242 subtracts the output of register 244 from the input to accumulator 240 and provides the difference at the sum output thereof.

The output of accumulator 240 provides the input to accumulator 250 which is the A input to adder 252. Accumulator 250 performs the third accumulation function. The output of adder 252 is coupled to and provides the input to register 254. The output of register 254, which is also the output of accumulator 250, is fed back as the B input to adder 252. Adder 252 subtracts the output of register 254 from the input to accumulator 250 and provides the difference at the sum output thereof. Accumulators 240 and 250 are clocked at the clock rate of the oversampling clock.

Interpolation filter 84 in the illustrative embodiment is a first-order comb filter which is achieved by a digital sample-and-hold. A higher-order comb filter might employ a barrel shift selector at its output. An equation describing the magnitude response of the interpolation filter is given by $$|H(\omega)| = \left[ \frac{\sin(\omega L1/2)}{\sin(\omega/2)} \right]^K$$

For interpolation filter 84 in the illustrative embodiment, K=1.

The invention is not limited to the interpolation or decimation factors being integers. For example, M1, M2, L1, L2 or L3 could be a fraction, such as a ratio of two integers, resulting in fractional clock division. Fractional clock division is taught in U.S. patent application Ser. No. 07/871,945, filed Apr. 22, 1992, entitled Clock Generators Having Programmable Fractional Frequency Division, and U.S. Pat. No. 5,088,057 entitled Rational Rate Frequency Generator.

For the interpolation filter and decimation filter, parameter K designates the order of the comb filter. For the comb decimation filter, the minimum number of accumulators is K and the minimum number of differentiators is K-1. For the comb interpolation filter, the minimum number of accumulators is K-1 and the minimum number of differentiators is K-1. Each interpolator has a low clock rate or sampling rate and a high clock rate or sampling rate. The series of divide-by circuits generates a series of clock frequencies. The output of a divide-by counter provides both the low-end frequency for a given interpolator and a high-end frequency for an interpolator upstream in the data path. While an exemplary embodiment showing a comb-cubed function for an interpolator and a decimator have been disclosed, the invention is not limited to the order, or parameter K being three. Similarly, variables L1 and L2 may take on practical ranges in a particular implementation, but the invention is not limited thereto. A multiple stage of sampling rate conversion where each stage is programmable does not require that the order of the comb filter be the same for each stage. Parameter K may be the same or different for each stage of sampling rate conversion. Gain normalization may be required following each stage of sampling rate conversion to avoid bit overflow of a data path. A data rate converter designed in accordance with the present invention permits that during operation of the data rate converter, the sampling rate converters may operate at different frequencies for portions of their operations then switch back to the original frequency for other portions of operation. This versatility can be achieved by maintaining the oversampling frequency constant and during operation, changing the divide-by clock parameters such as M1, M2, CDIV, L1, L2 and L3.

Data converters including sigma-delta modulators have typically had a fixed oversampling ratio. The output data rate of a data converter has been changed by changing the frequency of a high frequency clock and proportionately changing the frequency of a lower frequency clock. The usefulness of the noise-shaping property of the sigma-delta converter is limited by the fixed oversampling ratio. The oversampling ratio of a data converter can be changed by changing a decimation factor or an interpolation factor of the data converter. Changing the oversampling ratio provides an opportunity to make a tradeoff between the output data rate and the signal-to-noise ratio of the data converter. For example, a data converter having a second-order sigma-delta modulator will produce approximately 15 dB better resolution for each octave increase in the oversampling ratio, until the analog noise power dominates the baseband quantization error. Data converters having higher-order sigma-delta modulators will provide a different resolution, for example, a third-order sigma-delta modulator will produce a 21dB per octave improvement.

A data converter with the capability to change a decimation factor or an interpolation factor could operate at a first output data rate with a first decimation or interpolation factor. Operation of the data converter could be changed to a second output data rate by changing to a second decimation or interpolation ratio. This might occur during a start-up sequence that initiates operation of the data converter or during operation. Changing a decimation factor or an interpolation factor in combination with a change in the frequency of the high frequency clock input to a data converter provides two degrees of freedom in changing the output data rate from the data converter.

The invention is particularly useful in communication systems and equipment employing integrated circuits including this technique. Such communication systems and equipment have the advantage of providing programmable decimation or interpolation factors.

The invention is not limited to the numerical values used to disclose the illustrative embodiment. The bit-width output from various elements, the order of the various filters, the ranges for the interpolation and decimation factors and the output fields and ranges for the barrel shift selector and the number of bits of saturation, and the like, are exemplary in the illustrated embodiment.

While illustrative embodiment of the invention has not been described as incorporating pipelining or paralleling to reduce latency times, one skilled in the art would recognize the enhanced computational efficiency available by utilizing such techniques.

I claim:

1. A data converter for providing sampling rate conversion, comprising:

a first converter for receiving a clock signal, a divided-down clock signal, and first digital signal samples at a first rate, the first converter for converting the first digital signal samples to second digital signal samples at a second rate, the ratio of the first rate to the second rate being a first conversion rate factor; and a first programmable counter, the first programmable counter for receiving the clock signal and for dividing down the clock signal to produce the divided-down clock signal, the first programmable counter being programmable to selectively determine the first conversion rate factor.

2. A data converter as recited in claim 1, wherein the first rate is greater than the second rate resulting in a sampling rate conversion that is decimation.

3. A data converter as recited in claim 1, wherein the first rate is lower than the second rate resulting in a sampling rate conversion that is interpolation.

4. A data converter for providing sampling rate conversion, comprising:

a first converter for receiving a clock signal, a divided-down clock signal, and first digital signal samples at a first rate, the first converter for converting the first digital signal samples to second digital signal samples at a second rate, the ratio of the first rate to the second rate being a first conversion rate factor; and a first programmable counter, the first programmable counter for receiving the clock signal, and for dividing down the clock signal to produce the divided-down clock signal, the first programmable counter being programmable to selectively determine the first conversion rate factor;

a second converter for receiving the divided-down clock signal, a further divided down clock signal, and the second digital signal samples at the second rate, said second converter for converting the second digital signal samples to third digital signal samples at a third rate, the ratio of the second rate to the third rate being a second conversion rate factor; and a second programmable counter, the second programmable counter for receiving the divided-down clock signal and for dividing down the divided-down clock signal to produce a further-divided-down clock signal, the second programmable counter being programmable to selectively determine the second conversion rate factor.

5. A data converter as recited in claim 4, wherein the third rate is greater than the second rate, resulting in a sampling rate conversion that is decimation.

6. A data converter as recited in claim 4, wherein the third rate is lower than the second rate resulting in a sampling rate conversion that is interpolation.

7. A data converter as recited in claim 4, further comprising:
 a digital processor, one of said first and second converters within the digital processor, whereby at least one of the stages of signal conversion is achieved within the digital processor.

8. A data converter as recited in claim 7, wherein the sampling rate conversion achieved in the digital processor is interpolation.

9. A data converter as recited in claim 7, wherein the sampling rate conversion achieved in the digital processor is decimation.

10. A data converter as recited in claim 7, further comprising:
 a register, the register interposed between the first and second converters, the register for receiving the second digital samples at the second rate and temporarily storing the second digital samples, whereby a buffer is introduced between the first and second converters.

11. A data converter as recited in claim 10, wherein the register is a first-in-first-out register.

12. A data converter for providing sampling rate conversion, comprising:
 a first converter for receiving a first clock signal, a first divided-down clock signal, and first digital signal samples at a first rate, the first converter for converting the first digital signal samples to second digital signal samples at a second rate, the ratio of the first rate to the second rate being a first decimation factor;
 a first programmable counter, the first programmable counter for receiving the first clock signal and for dividing down the first clock signal to produce the first divided-down clock signal, the first programmable counter being programmable to selectively determine the first decimation factor;
 a digital processor, the digital processor comprising:
 a second converter for receiving a second clock signal, a second divided-down clock signal, and the second digital samples at the second digital rate, the second converter for converting the second digital signal samples to third digital signal samples at a third rate, the ratio of the second rate to the third rate being a second decimation factor;
 a second programmable counter, the second programmable counter for receiving the second clock signal and for dividing down the second clock signal to produce the second divided-down clock signal, the second programmable to selectively determine the second decimation factor;
 a third converter for receiving a third clock signal, a third divided-down clock signal, and fourth digital signal samples at a fourth rate, the third converter for converting the fourth digital signal samples to fifth digital signal samples at a fifth rate, the ratio of the fourth rate to the fifth rate being a first interpolation factor; and a third programmable counter, the third programmable counter for receiving the third clock signal and for dividing down the third clock signal to produce the third divided-down clock signal, the third programmable counter being programmable to selectively determine the first interpolation ratio; and
 a fourth converter for receiving a fourth clock signal, a fourth divided-down clock signal, and the fifth digital signal samples at a fifth rate, the fourth converter for converting the fifth digital signal samples to sixth digital signal samples at a sixth rate, the ratio of the fifth rate to the sixth rate being a second interpolation factor; and
 a fourth programmable counter, the fourth programmable counter for receiving the fourth programmable counter for receiving the fourth clock signal and for dividing down the fourth clock signal to produce the fourth divided-down clock signal, the fourth programmable counter being programmable to selectively determine the second interpolation ratio.

13. A data converter as recited in claim 12, further comprising:
 a register, the register interposed between the first and second converters, the register for receiving the second digital signal samples at the second rate and temporarily storing the second digital signal samples, whereby a buffer is introduced between the first and second converters.

14. A data converter as recited in claim 13, wherein the register is a first-in-first-out register.

15. A data converter as recited in claim 12, further comprising:
 a register, the register interposed between the third and fourth converters, the register for receiving the fourth digital signal samples at the fourth rate and temporarily storing the fourth digital signal samples, whereby a buffer is introduced between the third and fourth converters.

16. A data converter as recited in claim 15, wherein the register is a first-in-first-out register.

17. A data converter as recited in claim 12, further comprising:
 a first register, the first register interposed between the first and second converters, the first register for receiving the second digital signal samples at the second rate and temporarily storing the second digital signal samples; and
 a second register, the second register interposed between the third and fourth converters, the second register for receiving the fourth digital signal samples at the fourth rate and temporarily storing the fourth digital signal samples, whereby a first buffer is introduced between the first and second converters, and a second buffer is introduced between the third and fourth converters.

18. A data converter as recited in claim 17, wherein one of the first register and the second register is a first-in-first-out register.

19. A method of operating a data converter, the data converter receiving a clock signal and a divided-down clock signal, the data converter capable of receiving first digital signal samples at a first rate and converting the first digital signal samples to second digital signal samples at a second rate, the ratio of the first rate to the second rate being a conversion rate factor, the method comprising the steps of:

operating the data converter at a first conversion rate factor; and changing the conversion rate factor to a second conversion rate factor such that the ratio of the first rate to the second rate changes.

20. A method of operating a data converter as recited in claim 19, further comprising the step of changing the frequency of the clock signal, whereby the change in the conversion rate factor and the change in the frequency of the clock signal contribute to changing the second rate.

* * * * *